United States Patent
Wu

(10) Patent No.: US 10,746,631 B2
(45) Date of Patent: Aug. 18, 2020

(54) METHOD AND APPARATUS FOR ESTIMATING PARAMETERS OF A DC MACHINE BY LEAST-SQUARES METHOD

(71) Applicant: I-SHOU UNIVERSITY, Kaohsiung (TW)

(72) Inventor: Rong-Ching Wu, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 408 days.

(21) Appl. No.: 15/689,880

(22) Filed: Aug. 29, 2017

(65) Prior Publication Data
US 2018/0202900 A1    Jul. 19, 2018

(30) Foreign Application Priority Data
Jan. 19, 2017    (TW) .............................. 106101866 A

(51) Int. Cl.
*G01M 99/00* (2011.01)
*G01R 31/34* (2020.01)
*G06F 17/17* (2006.01)

(52) U.S. Cl.
CPC ........... *G01M 99/008* (2013.01); *G01R 31/34* (2013.01); *G06F 17/17* (2013.01)

(58) Field of Classification Search
CPC ................................................. G01M 99/008
USPC ....................................................... 702/179
See application file for complete search history.

(56) References Cited

U.S. PATENT DOCUMENTS

| 8,094,405 | B1 * | 1/2012 | Ying | G11B 5/59627 |
| | | | | 360/77.04 |
| 8,848,303 | B1 * | 9/2014 | Yamada | G11B 5/59644 |
| | | | | 360/27 |
| 9,160,260 | B1 * | 10/2015 | Keas | H02P 29/50 |
| 2002/0156541 | A1 * | 10/2002 | Yutkowitz | G05B 11/28 |
| | | | | 700/28 |
| 2010/0114518 | A1 * | 5/2010 | Lindberg | G01D 5/24452 |
| | | | | 702/94 |
| 2011/0057595 | A1 * | 3/2011 | Flanary | H02P 1/029 |
| | | | | 318/473 |

* cited by examiner

*Primary Examiner* — Ricky Ngon
(74) *Attorney, Agent, or Firm* — WPAT, PC

(57) ABSTRACT

A method for estimating parameters of a DC machine by the least-squares method is performed by a computer system. The method includes establishing a transient model of the DC machine; expressing discrete values of the terminal voltage, the armature current and the rotational speed of the DC machine by the polynomial regression after the DC machine is started; obtaining estimated values of an armature resistance, an armature inductance and a back electromotive force constant by the least-squares method; calculating a torque based on the back electromotive force constant and the armature current; obtaining estimated values of a moment of inertia and a viscous friction coefficient by the least-squares method; and outputting the estimated values of the armature resistance, the armature inductance, the back electromotive force constant, the moment of inertia and the viscous friction coefficient. As such, the accuracy and reliability in estimating the parameters of the DC machine can be improved, achieving high computational efficiency and simplifying the operation procedure.

10 Claims, 9 Drawing Sheets

METHOD AND APPARATUS FOR ESTIMATING PARAMETERS OF A DC MACHINE BY LEAST-SQUARES METHOD

CROSS REFERENCE TO RELATED APPLICATIONS

The application claims the benefit of Taiwan application serial No. 106101866, filed on Jan. 19, 2017, and the entire contents of which are incorporated herein by reference.

BACKGROUND OF THE INVENTION

1. Field of the Invention

The present disclosure generally relates to a method and an apparatus for estimating the parameters of a direct current (DC) machine and, more particularly, to a method and an apparatus for estimating the parameters of the DC machine by the least-squares method.

2. Description of the Related Art

Direct Current (DC) machines have been widely used for the household and industrial control purposes due to the advantages such as higher starting torque, higher speed control efficiency, the convenience in accurately controlling the speed and acquiring the DC power as well as easy implementation of the control circuits. In order to design a DC machine that can accurately identify the system parameters, the design analysis is carried out mostly based on the equivalent model of the DC machine.

For example, the models often used in the analysis of the DC machine can be divided into two categories, namely a transient model and a steady-state model. In the transient model, the terminal voltage, the armature current and the rotational speed of the DC machine always change due to the behavior of the transient model, so that the energy storage elements of the DC machine will affect the behavior of the DC machine. The energy storage elements include an armature inductance in the equivalent circuit of the DC machine and an equivalent model of the DC machine. Specifically, during the estimation of the parameters of the equivalent circuit, the terminal voltage, the armature current and the rotational speed are disturbed by the noise due to the commutation of the DC machine. Besides, the actual structure of the DC machine is much more complex than the transient model, leading to the errors between the estimated parameter values and the actual parameter values of the DC machine.

In light of this, it is necessary to avoid the noise interference as well as to reduce the errors to meet the actual needs of the parameter estimation and to enhance its utility.

SUMMARY OF THE INVENTION

It is therefore an objective of this disclosure to provide a method and an apparatus for estimating the parameters of a DC machine by the least-squares method, so as to avoid the noise interference and reduce the errors between the estimated parameter values and the actual parameter values of the DC machine.

In an embodiment of the disclosure, a method for estimating the parameters of a DC machine by the least-squares method uses a computer system to estimate the parameters of the DC machine. The computer system provides an electrical detection function, a signal conversion function and a numerical calculation function. The method includes establishing a transient model of the DC machine. The transient model includes an equivalent circuit and an equivalent mechanism. The equivalent circuit includes an armature resistance, an armature inductance and a back electromotive force. The equivalent mechanism includes a torque, a moment of inertia and a viscous friction coefficient. The method further includes sampling the terminal voltage, the armature current and the rotational speed of the DC machine at a plurality of time points by the computer system, quantizing each of the terminal voltage, the armature current and the rotational speed into a discrete value at each of the plurality of time points when the direct current machine is started, expressing the discrete values of the terminal voltage, the armature current and the rotational speed by polynomial regression, calculating a product of the armature resistance and the armature current, a product of the armature inductance and a time-varying rate of the armature current, and a product of the back electromotive force constant and the rotational speed, adding the three products to obtain an estimated voltage value, expressing a difference between the terminal voltage and the estimated voltage value by the least-squares method as a first error function, obtaining estimated values of the armature resistance, the armature inductance and the back electromotive force constant according to the first error function, calculating a value of the torque based on the back electromotive force constant and the armature current, calculating another product of the moment of inertia and the a time-varying rate of the rotational speed, and a further product of the viscous friction coefficient and the rotational speed, adding the other product and the further product to obtain an estimated torque value, expressing a difference between the value of the torque and the estimated torque value by the least-squares method as a second error function, and obtaining estimated values of the moment of inertia and the viscous friction coefficient according to the second error function; and outputting the estimated values of the armature resistance, the armature inductance, the back electromotive force constant, the moment of inertia and the viscous friction coefficient.

In a preferred form shown, the discrete values of the terminal voltage, the armature current and the rotational speed are expressed by the polynomial regression as $\hat{y}_n = a_m n^m + a_{m-1} n^{m-1} + \ldots + a_1 n + a_0$, $n=1, \ldots, N$. "$\hat{y}_n$" is the discrete value of the terminal voltage, the armature current or the rotational speed, "n" is a sampling sequence of the terminal voltage, the armature current or the rotational speed, and $[a_0, a_1, \ldots, a_{m-1}, a_m]$ are polynomial coefficients of a m-degree polynomial.

In a preferred form shown, the first error function is expressed as $$E_V = \sum_{n=1}^{N} \left( v_n - R_a i_n - L_a \frac{di_n}{dt} - K_E \omega_n \right)^2.$$

"$E_V$" is the difference between the terminal voltage and the estimated voltage value. "$v_n$", "$i_n$" and "$\omega_n$" are the discrete values of the terminal voltage, the armature current and the rotational speed. "$R_a$" is the armature resistance, "$L_a$" is the armature inductance, "$di_n/dt$" is the time-varying rate of the armature current, "$K_E$" is the back electromotive force constant, and "n" is the sampling sequence of the terminal voltage, the armature current and the rotational speed.

In a preferred form shown, when the partial derivatives of the armature resistance, the armature inductance and the back electromotive force constant are made zero, the estimated values of the armature resistance, the armature inductance and the back electromotive force constant are calculated as:

$$\begin{bmatrix} R_a \\ L_a \\ K_E \end{bmatrix} = \begin{bmatrix} \sum_{n=1}^{N} i_n i_n & \sum_{n=1}^{N} \frac{di_n}{dt} i_n & \sum_{n=1}^{N} \omega_n i_n \\ \sum_{n=1}^{N} i_n \frac{di_n}{dt} & \sum_{n=1}^{N} \frac{di_n}{dt} \frac{di_n}{dt} & \sum_{n=1}^{N} \omega_n \frac{di_n}{dt} \\ \sum_{n=1}^{N} i_n \omega_n & \sum_{n=1}^{N} \frac{di_n}{dt} \omega_n & \sum_{n=1}^{N} \omega_n \omega_n \end{bmatrix}^{-1} \begin{bmatrix} \sum_{n=1}^{N} v_n i_n \\ \sum_{n=1}^{N} v_n \frac{di_n}{dt} \\ \sum_{n=1}^{N} v_n \omega_n \end{bmatrix}.$$

In a preferred form shown, the second error function is calculated as $$E_T = \sum_{n=1}^{N} \left( T_n - J \frac{d\omega_n}{dt} - B\omega_n \right)^2.$$

"$E_T$" is the difference between the torque and the estimated torque value, "$T_n$" is the torque, "J" is the moment of inertia, "$d\omega_n/dt$" is the time-varying rate of the rotational speed, "B" is the viscous friction coefficient, $\omega_n$ is the discrete value of the rotational speed, and "n" is the sampling sequence of the rotational speed, n=1, 2, ..., N.

In a preferred form shown, when the partial derivatives of the moment of inertia and the viscous friction coefficient are made zero, the estimated values of the moment of inertia and the viscous friction coefficient are calculated as;

$$\begin{bmatrix} J \\ B \end{bmatrix} = \begin{bmatrix} \sum_{n=1}^{N} \left(\frac{d\omega_n}{dt}\right)^2 & \sum_{n=1}^{N} \omega_n \frac{d\omega_n}{dt} \\ \sum_{n=1}^{N} \omega_n \frac{d\omega_n}{dt} & \sum_{n=1}^{N} (\omega_n)^2 \end{bmatrix}^{-1} \begin{bmatrix} \sum_{n=1}^{N} T_n \frac{d\omega_n}{dt} \\ \sum_{n=1}^{N} T_n \omega_n \end{bmatrix}.$$

In a preferred form shown, the computer system samples the armature current at the plurality of time points by a Hall device.

In a preferred form shown, the computer system samples the rotational speed at the plurality of time points by a frequency/voltage converter and a photo interrupter.

In a preferred form shown, the computer system samples the terminal voltage at the plurality of time points by a resistor-formed voltage divider.

In an embodiment of the disclosure, an apparatus for estimating parameters of a DC machine by the least-squares method comprises a computer system used to perform the above method for estimating the parameters of the DC machine by the least-squares method mentioned above.

In summary, through expressing the discrete values of the terminal voltage, the armature current and the rotational speed by the polynomial regression, the method for estimating the parameters of the DC machine by the least-squares method according to an embodiment of the disclosure is able to maintain the transition characteristics of the DC machine during the filtering process of the noise. Moreover, the method according to the embodiment of the disclosure may minimize the difference between the estimated parameter value of the DC machine and the actual value by the least-squares method, allowing the estimated value of the DC machine parameter to be close to the actual value and to be consistent with the actual behavior of the DC machine. Furthermore, the estimated value is obtained by a single operation, eliminating the need of multiple iterative operation steps. Advantageously, the accuracy and reliability in estimating the parameters of the DC machine can be improved, achieving high computational efficiency as well as simplifying the operation procedure.

BRIEF DESCRIPTION OF THE DRAWINGS

The present disclosure will become more fully understood from the detailed description given hereinafter and the accompanying drawings which are given by way of illustration only, and thus are not limitative of the present invention, and wherein.

DETAILED DESCRIPTION OF THE INVENTION

Figure 1A:
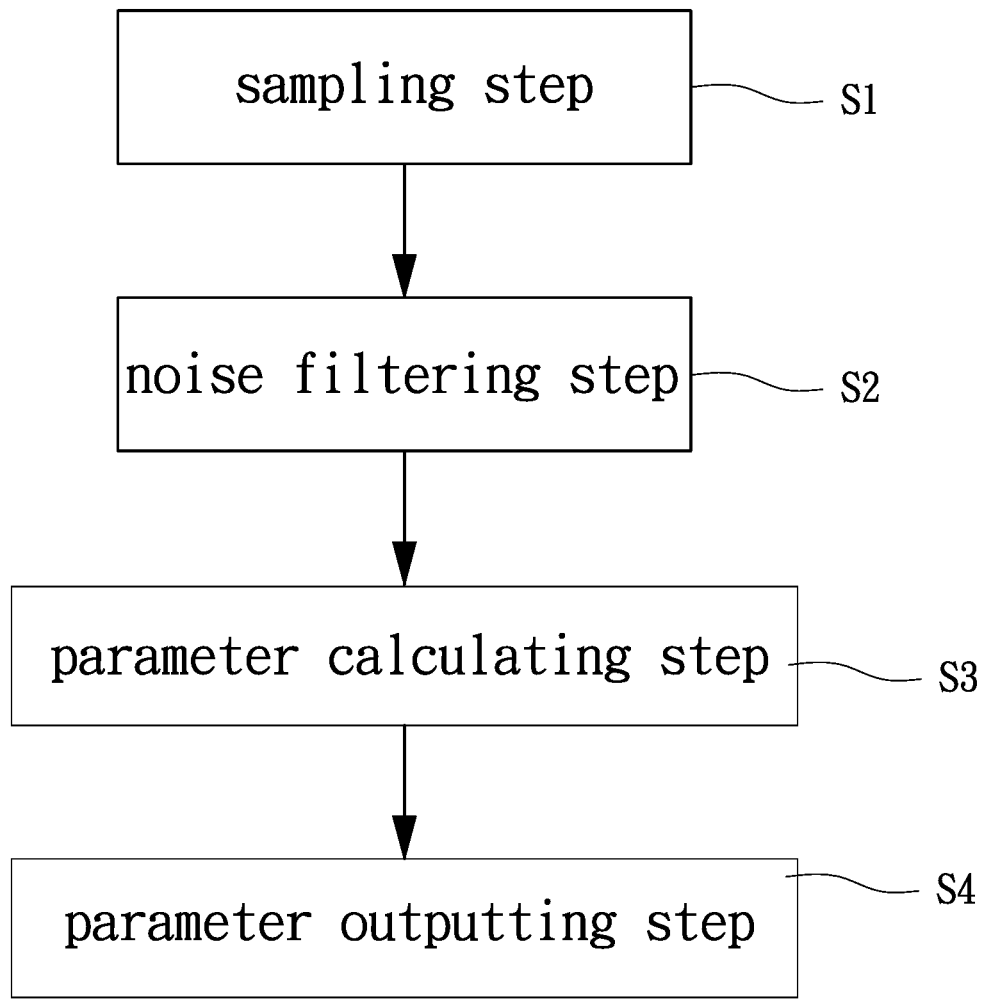
FIG. 1a shows a block diagram illustrating a method for estimating the parameters of a DC machine by the least-squares method according to an embodiment of the disclosure.

With reference to FIG. 1a, which is a block diagram illustrating a method for estimating the parameters of a DC machine by the least-squares method according to an embodiment of the disclosure. The method may be performed by a computer system (e.g., an industrial personal computer, IPC) for executing a parameter estimation program and outputting an DC machine parameter, such as an armature resistance, an armature inductance, a back electromotive force (back EMF) constant, a moment of inertia or a viscous friction coefficient.

Figure 1B:
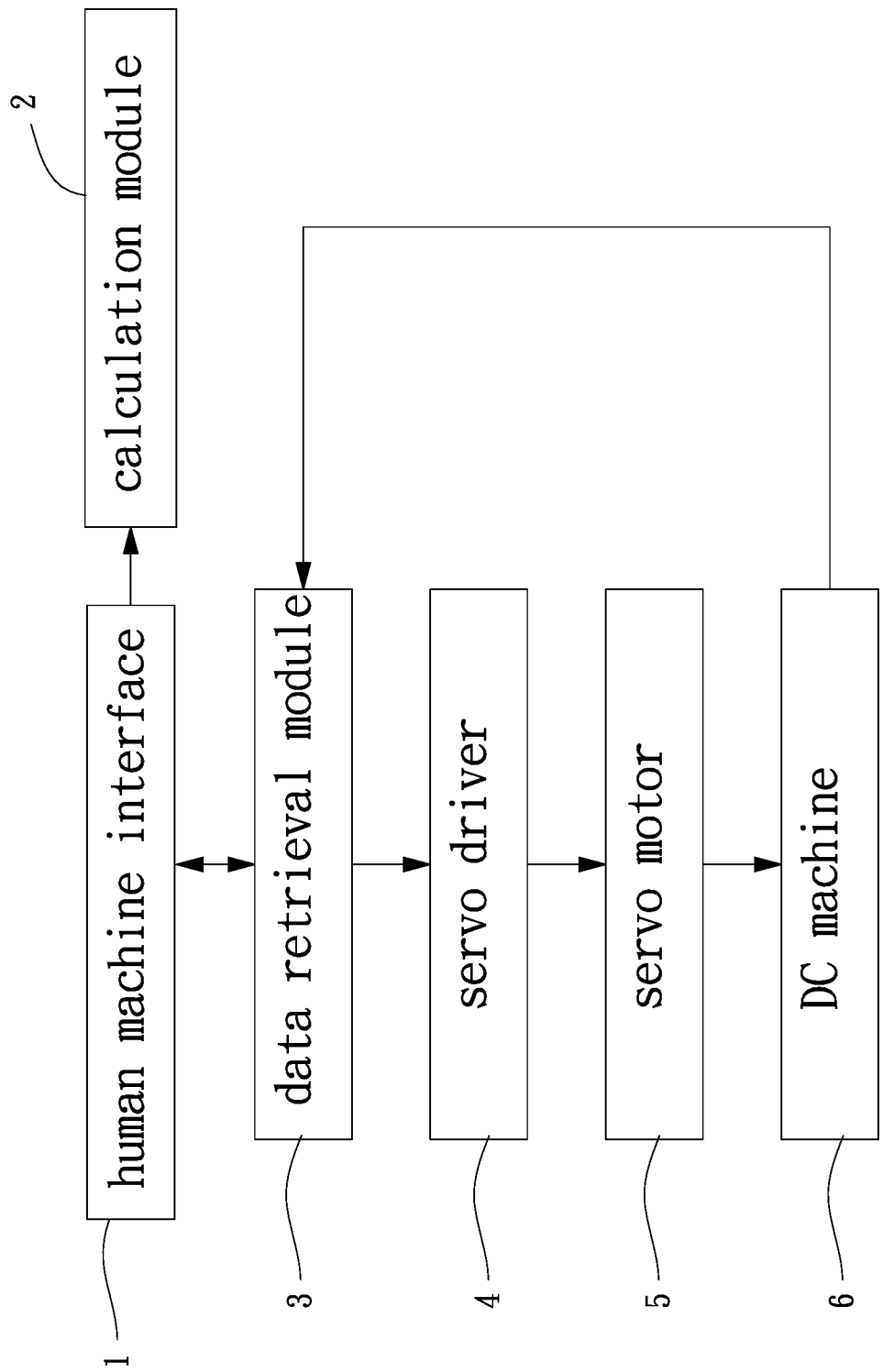
FIG. 1b shows a block diagram of a computer system dedicated to performing the method for estimating the parameters of the DC machine by the least-squares method according to the embodiment of the disclosure.

In this embodiment, referring to FIG. 1b, the hardware architecture of the computer system includes a calculation module 1, a human machine interface 2, a data retrieval module 3, a servo driver 4, a servo motor 5 and a DC machine 6. The calculation module 1 is used to calculate the parameters of the DC machine 6. The human machine interface 2 is electrically connected to the calculation module 1 and is used to set, read and display the operating status of the DC machine 6. The data retrieval module 3 is electrically connected to the calculation module 1 and is capable of outputting a command regarding the rotational speed to the servo driver 4 to drive the servo motor 5. The servo motor 5 is able to drive the DC machine 6 to generate electricity. The data retrieval module 3 may include a signal capture card and a plurality of sensors, but is not limited thereto.

In view of the foregoing, once the DC machine is started, the computer system can have an electrical detection function that samples the terminal voltage, the armature current and the rotational speed of the DC machine at different time points. In this embodiment, the computer system may sample the terminal voltage at different time points by a voltage sensing device (e.g., a resistor-formed voltage divider), sample the armature current at different time points by a Hall device, as well as sample the rotational speed at different time points by a frequency/voltage converter and a photo interrupter. However, this is not used to limit the disclosure. Furthermore, the computer system can have a signal conversion function that respectively quantizes the terminal voltage, the armature current and the rotational speed into discrete values based on the sampling time, and can have a calculation function that calculates the parameters of the DC machine.

The method for estimating the parameters of the DC machine by the least-squares method according to the embodiment of the disclosure may include, but is not limited to, a sampling step S1, a noise filtering step S2, a parameter calculating step S3 and a parameter outputting step S4.

Figure 2:
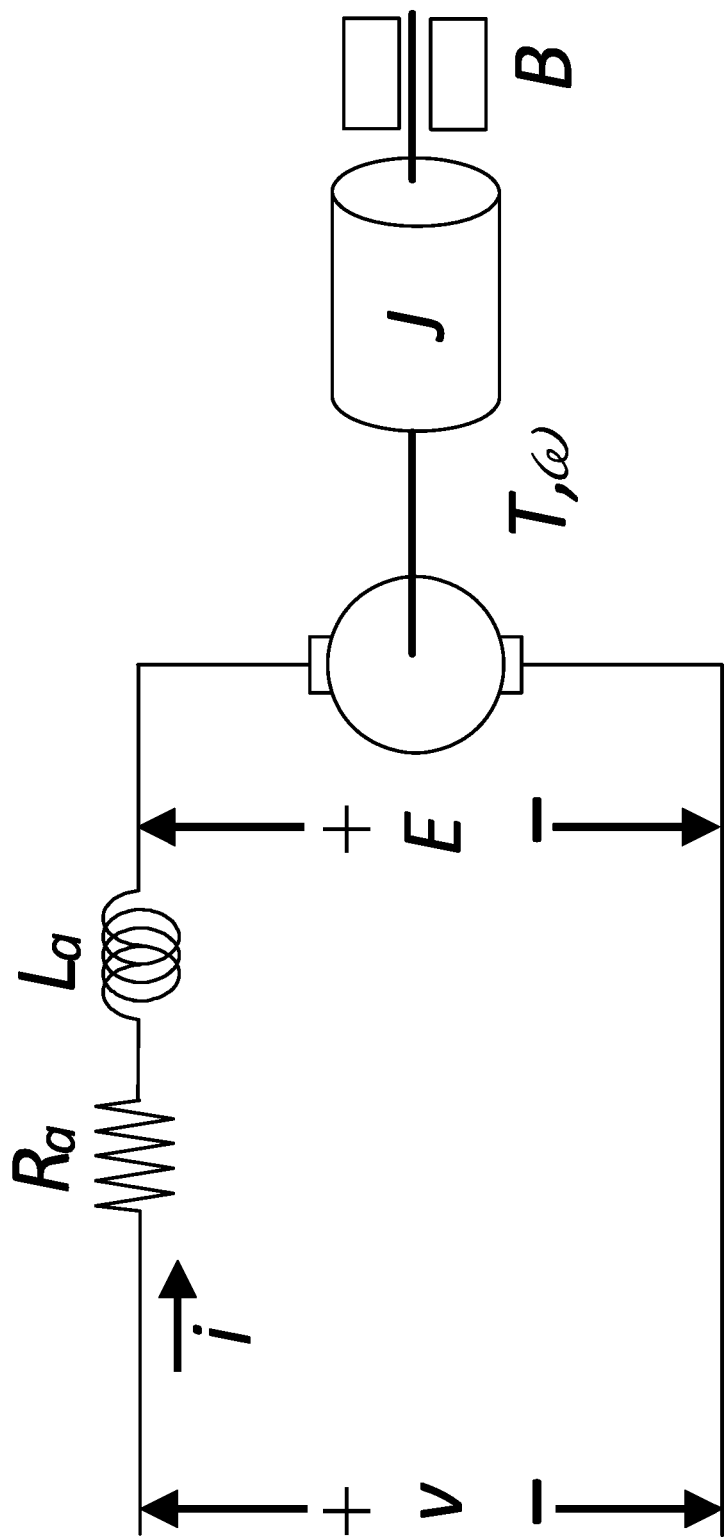
FIG. 2 shows a circuit diagram illustrating a transient model used by the method for estimating the parameters of the DC machine by the least-squares method according to the embodiment of the disclosure.

With reference to FIG. 2, which is a circuit diagram illustrating a transient model used by the method for estimating the parameters of the DC machine by the least-squares method according to the embodiment of the disclosure. In the sampling step S1, the transient model of the DC machine is established. The transient model includes an equivalent circuit and an equivalent mechanism. The equivalent circuit includes an armature $R_a$, an armature inductance $L_a$ and a back electromotive force E of the DC machine. The equivalent mechanism includes a torque T, a moment of inertia J and a viscous friction coefficient B of the DC machine. Next, the terminal voltage, the armature current and the rotational speed of the DC machine are sampled at different time points by the electrical detection function of the computer system. The terminal voltage, the armature current and the rotational speed are respectively quantized into discrete values based on the sampling time by the signal conversion function of the computer system.

The terminal voltage is expressed as the following equation (1):

$$v = R_a i + L_a \frac{di}{dt} + E, \qquad (1).$$

Specifically, "v" is the discrete value of the terminal voltage, "$R_a$" is the armature resistance, "i" is the discrete value of the armature current, "$L_a$" is the armature inductance, "di/dt" is the time-varying rate of the armature current, and "E" is a back electromotive force.

Since the back electromotive force (E) is proportional to the rotational speed (ω), the above equation (1) may be rewritten as the following equation (2):

$$v = R_a i + L_a \frac{di}{dt} + K_E \omega, \qquad (2).$$

Specifically, "v" is the discrete value of the terminal voltage, "$R_a$" is the armature resistance, "i" is the discrete value of the armature current, "$L_a$" is the armature inductance, "di/dt" is the time-varying rate of the armature current, "$K_E$" is the back electromotive force constant, and "ω" is the discrete value of the rotational speed.

Moreover, the relationship of the equivalent mechanism is expressed as the following equation (3):

$$T = J\frac{d\omega}{dt} + B\omega, \qquad (3).$$

Specifically, "T" is the torque, "J" is the moment of inertia, "dω/dt" is the time-varying rate of the rotational speed, "B" is the viscous friction coefficient, and "ω" is the discrete value of the rotational speed.

Since the terminal voltage, the armature current and the rotational speed may contain a large amount of noise due to commutation of the DC machine, the difference between the estimated parameter value of the DC machine as calculated and the actual value may be large. As a result, the actual behavior of the DC machine cannot be reflected correctly.

Therefore, the noise contained in the terminal voltage, the armature current and the rotational speed are filtered in the noise filtering step S2, permitting the estimated parameter value of the DC machine to be close to the actual value. In this embodiment, the noise filtering step S2 may express the discrete values of the terminal voltage, the armature current and the rotational speed by the polynomial regression, and may filter the noise contained in the terminal voltage, the armature current and the rotational speed. However, the disclosure is not limited to the above implementation. Besides, the noise filtering step S2 is able to maintain the transition characteristics of the DC machine during the filtering process of the noise, so that the estimated parameter value of the DC machine is consistent with the actual behavior of the DC machine.

Specifically, referring to FIG. 1a, the discrete values of the terminal voltage, the armature current and the rotational speed are expressed by the polynomial regression, and the noise contained in the terminal voltage, the armature current and the rotational speed are filtered.

This can be expressed as the following equation (4):

$$\hat{y}_n = a_m n^m + a_{m-1} n^{m-1} + \ldots + a_1 n + a_0, \quad n=1, \ldots, N, \quad (4)$$

Specifically, "$\hat{y}_n$" is the discrete value of the terminal voltage, the armature current or the rotational speed, "n" is the sampling sequence of the terminal voltage, the armature current or the rotational speed, and $[a_0, a_1, \ldots, a_{m-1}, a_m]$ are polynomial coefficients of a m-degree polynomial.

Based on the above, in order to calculate the polynomial coefficients, the above equation (4) can be rewritten as the following equation (5):

$$\begin{bmatrix} a_m \\ a_{m-1} \\ \vdots \\ a_0 \end{bmatrix} = \begin{bmatrix} \sum_{n=1}^{N} n^{2m} & \sum_{n=1}^{N} n^{2m-1} & \ldots & \sum_{n=1}^{N} n^m \\ \sum_{n=1}^{N} n^{2m-1} & \sum_{n=1}^{N} n^{2m-2} & \ldots & \sum_{n=1}^{N} n^{m-1} \\ \vdots & \vdots & \vdots & \vdots \\ \sum_{n=1}^{N} n^m & \sum_{n=1}^{N} n^{m-1} & \ldots & \sum_{n=1}^{N} 1 \end{bmatrix}^{-1} \begin{bmatrix} \sum_{n=1}^{N} y_n n^m \\ \sum_{n=1}^{N} y_n n^{m-1} \\ \vdots \\ \sum_{n=1}^{N} y_n \end{bmatrix}, \quad (5)$$

Furthermore, in order for the estimated parameter value of the DC machine to be close to the actual value, the parameter calculating step S3 may minimize the difference between the estimated parameter value of the DC machine and the actual value by the least-squares method. In this manner, the estimated parameter value of the DC machine can be close to the actual value.

In the embodiment, in order for the estimated values of the armature resistance ($R_a$), the armature inductance ($L_a$) and the back electromotive force constant ($K_E$) to be close to actual values, the parameter calculating step S3 may calculate the product of the armature resistance ($R_a$) and the armature current, the product of the armature inductance ($L_a$) and the time-varying rate of the armature current, and the product of the back electromotive force constant ($K_E$) and the rotational speed ($\omega$). The sum of the three products is expressed as an estimated voltage value, and the difference between the terminal voltage and the estimated voltage value is expressed by the least-squares method as a first error function for calculating the estimated values of the armature resistance ($R_a$), the armature inductance ($L_a$) and the back electromotive force constant ($K_E$). The first error function is expressed as the following equation (6):

$$E_V = \sum_{n=1}^{N} \left( v_n - R_a i_n - L_a \frac{di_n}{dt} - K_E \omega_n \right)^2, \quad (6)$$

Specifically, "$E_V$" is the difference between the terminal voltage and the estimated voltage value, "$v_n$", "$i_n$" and "$\omega_n$" are discrete values of the terminal voltage, the armature current and the rotational speed, "$R_a$" is the armature resistance, "$L_a$" is the armature inductance, "$di_n/dt$" is the time-varying rate of the armature current, "$K_E$" is a constant of the back electromotive force, and "n" is the sampling sequence of the terminal voltage, the armature current and the rotational speed.

Moreover, the partial derivatives of the armature resistance ($R_a$), the armature inductance ($L_a$) and the back electromotive force constant ($K_E$) are respectively made zero, so that the armature resistance ($R_a$), the armature inductance ($L_a$) and the back electromotive force constant ($K_E$) can be expressed as follows:

$$\frac{\partial E_V}{\partial R_a} = 2 \sum_{n=1}^{N} \left( v_n - R_a i_n - L_a \frac{di_n}{dt} - k_E \omega_n \right)(-i_n) = 0, \quad (7)$$

$$\frac{\partial E_V}{\partial L_a} = 2 \sum_{n=1}^{N} \left( v_n - R_a i_n - L_a \frac{di_n}{dt} - k_E \omega_n \right)\left(-\frac{di_n}{dt}\right) = 0, \quad (8)$$

$$\frac{\partial E_V}{\partial K_E} = 2 \sum_{n=1}^{N} \left( v_n - R_a i_n - L_a \frac{di_n}{dt} - k_E \omega_n \right)(-\omega_n) = 0, \quad (9)$$

In view of the foregoing, the above equations (7), (8) and (9) can be respectively rewritten as follows:

$$\sum_{n=1}^{N} v_n i_n = R_a \sum_{n=1}^{N} i_n i_n + L_a \sum_{n=1}^{N} \frac{di_n}{dt} i_n + K_E \sum_{n=1}^{N} \omega_n i_n, \quad (10)$$

$$\sum_{n=1}^{N} v_n \frac{di_n}{dt} = R_a \sum_{n=1}^{N} i_n \frac{di_n}{dt} + L_a \sum_{n=1}^{N} \frac{di_n}{dt}\frac{di_n}{dt} + K_E \sum_{n=1}^{N} \omega_n \frac{di_n}{dt}, \quad (11)$$

$$\sum_{n=1}^{N} v_n \omega_n = R_a \sum_{n=1}^{N} i_n \omega_n + L_a \sum_{n=1}^{N} \frac{di_n}{dt}\omega_n + K_E \sum_{n=1}^{N} \omega_n \omega_n, \quad (12)$$

The above equations (10), (11) and (12) can be represented by matrices as shown below:

$$AB = C \quad (13)$$

$$A = \begin{bmatrix} \sum_{n=1}^{N} i_n i_n & \sum_{n=1}^{N} \frac{di_n}{dt} i_n & \sum_{n=1}^{N} \omega_n i_n \\ \sum_{n=1}^{N} i_n \frac{di_n}{dt} & \sum_{n=1}^{N} \frac{di_n}{dt}\frac{di_n}{dt} & \sum_{n=1}^{N} \omega_n \frac{di_n}{dt} \\ \sum_{n=1}^{N} i_n \omega_n & \sum_{n=1}^{N} \frac{di_n}{dt}\omega_n & \sum_{n=1}^{N} \omega_n \omega_n \end{bmatrix},$$

$$B = \begin{bmatrix} R_a & L_a & K_E \end{bmatrix}^T$$

$$C = \begin{bmatrix} \sum_{n=1}^{N} v_n i_n & \sum_{n=1}^{N} v_n \frac{di_n}{dt} & \sum_{n=1}^{N} v_n \omega_n \end{bmatrix}^T.$$

Specifically, with proper matrix multiplication, the matrix B in the above equation (13) can be expressed by the following equation (14):

$$B = A^{-1} C, \quad (14)$$

Specifically, the matrix B is the matrix of the armature resistance ($R_a$), the armature inductance ($L_a$) and the back electromotive force constant ($K_E$), and the matrix $A^{-1}$ is the inverse matrix of the matrix A in the above equation (13). As such, the estimated values of the armature resistance ($R_a$), the armature inductance ($L_a$) and the back electromotive force constant ($K_E$) can be obtained according to the above equation (14). The difference between each estimated value and a respective actual value is minimized.

Furthermore, the torque (T) can be derived from the following equation (15):

$$T = K_T i, \quad (15)$$

Specifically, "T" is the torque, "$K_T$" is a torque constant, and "i" is the discrete value of the armature current.

In addition, since the torque constant ($K_T$) is equal to the back electromotive force constant ($K_E$), the time-varying rate of the rotational speed can be obtained from the rotational speed ($\omega$), and the time-varying rate of the rotational speed can be derived from the following equation (16):

$$\frac{d\omega_n}{dt} = (\omega_n - \omega_{n-1}) * f_s, \tag{16}$$

Specifically, "$d\omega_n/dt$" is the time-varying rate of the rotational speed, $\omega_n$ is the discrete value of the rotational speed, and "n" is the sampling sequence of the rotational speed (e.g., n=1, 2, ..., N).

Therefore, in this embodiment, in order for the estimated values of the moment of inertia (J) and the viscous friction coefficient (B) to be close to the actual values, the parameter calculating step S3 can calculate the product of the moment of inertia (J) and the time-varying rate of the rotational speed, as well as the product of the viscous friction coefficient (B) and the rotational speed. The sum of the two products is expressed as an estimated torque value, and the difference between the torque and the estimated torque value is expressed by the least-squares method as a second error function for calculating the estimated values of the moment of inertia (J) and the viscous friction coefficient (B).

In addition, when the DC machine is a linear system, the moment of inertia (J) and the viscous friction coefficient (B) are constants. Thus, the second error function can be expressed as the following equation (17):

$$E_T = \sum_{n=1}^{N}\left(T_n - J\frac{d\omega_n}{dt} - B\omega_n\right)^2, \tag{17}$$

Specifically, "$E_T$" is the difference between the torque and the estimated torque value, "$T_n$" is the torque, "J" is the moment of inertia, "$d\omega_n/dt$" is the time-varying rate of the rotational speed, "B" is the viscous friction coefficient, $\omega_n$ is the discrete value of the rotational speed, and "n" is the sampling sequence of the rotational speed (e.g., n=1, 2, ..., N).

Based on this, the moment of inertia (J) and the viscous friction coefficient (B) are better when the difference between each estimated value and a respective one of the actual values is minimized. Therefore, the gradients of the values J and B in the above equation (17) are made zero (namely, the partial derivatives of the moment of inertia (J) and the viscous friction coefficient (B) are made zero), such that the estimated values of the moment of inertia (J) and the viscous friction coefficient (B) can be expressed as the following equation (18):

$$\begin{bmatrix} J \\ B \end{bmatrix} = \begin{bmatrix} \sum_{n=1}^{N}\left(\frac{d\omega_n}{dt}\right)^2 & \sum_{n=1}^{N}\omega_n\frac{d\omega_n}{dt} \\ \sum_{n=1}^{N}\omega_n\frac{d\omega_n}{dt} & \sum_{n=1}^{N}(\omega_n)^2 \end{bmatrix}^{-1}\begin{bmatrix} \sum_{n=1}^{N}T_n\frac{d\omega_n}{dt} \\ \sum_{n=1}^{N}T_n\omega_n \end{bmatrix}, \tag{18}$$

Specifically, "J" is the moment of inertia, "B" is the viscous friction coefficient, "$d\omega_n/dt$" is the time-varying rate of the rotational speed, $\omega_n$ is the discrete value of the rotational speed, "$T_n$" is the torque, and "n" is the sampling sequence of the rotational speed (e.g., n=1, 2, ..., N). As such, the estimated values of moment of inertia (J) and the viscous friction coefficient (B) can be obtained according to the above equation (18), and the difference between each estimated value and a respective one of the actual values is minimized.

The parameter outputting step S4 may output the estimated value of the parameter of the DC machine by the computer system. In this embodiment, there are several estimated values that can be outputted. These values may include, but are not limited to, the armature resistance ($R_a$), the armature inductance ($L_a$), the back electromotive force constant ($K_E$), the moment of inertia (J) and the viscous friction coefficient (B).

The following Table 1 is the calculated result of the polynomial regression based on the parameters of the equivalent circuit.

TABLE 1

| Degree | Quantity | $n^8$ | $n^7$ | $n^6$ | $n^5$ | $n^4$ | $n^3$ | $n^2$ | $n^1$ | $n^0$ | $E_S$ (*$10^{-6}$) |
|---|---|---|---|---|---|---|---|---|---|---|---|
| 5 | Voltage(V) | | | | 0.75 | −3.87 | 7.89 | −8.20 | 4.46 | 4.08 | 77.3 |
|   | Current(A) | | | | −0.71 | 3.59 | −7.28 | 7.53 | −4.08 | 1.17 | 15000 |
|   | Rotational speed (rps) | | | | −7.75 | 33.13 | −50.37 | 28.86 | 0.83 | −0.12 | 117.0 |
| 6 | Voltage(V) | | | −0.59 | 3.44 | −8.48 | 11.62 | −9.62 | 4.68 | 4.07 | 77.8 |
|   | Current(A) | | | 0.39 | −2.48 | 6.63 | −9.74 | 8.46 | −4.22 | 1.18 | 15000 |
|   | Rotational speed (rps) | | | −0.59 | 3.44 | −8.48 | 11.62 | −9.62 | 4.68 | 4.07 | 39.2 |
| 7 | Voltage(V) | | −0.73 | 3.29 | −4.70 | 0.09 | 6.89 | −8.33 | 4.53 | 4.07 | 77.8 |
|   | Current(A) | | 0.83 | −4.03 | 6.80 | −3.14 | −4.34 | 6.98 | −4.06 | 1.17 | 15000 |
|   | Rotational speed (rps) | | −9.77 | 62.21 | −163.71 | 228.88 | −179.20 | 71.01 | −4.89 | 0.07 | 28.9 |
| 8 | Voltage(V) | 3.63 | −22.76 | 57.83 | −75.57 | 51.75 | −14.00 | −4.00 | 4.15 | 4.08 | 77.8 |
|   | Current(A) | −3.35 | 21.17 | −54.38 | 72.23 | −50.83 | 14.94 | 2.99 | −3.71 | 1.17 | 15000 |
|   | Rotational speed (rps) | 4.88 | −39.36 | 135.46 | −258.88 | 298.27 | −207.27 | 76.82 | −5.39 | 0.09 | 29.3 |

Figure 3A:
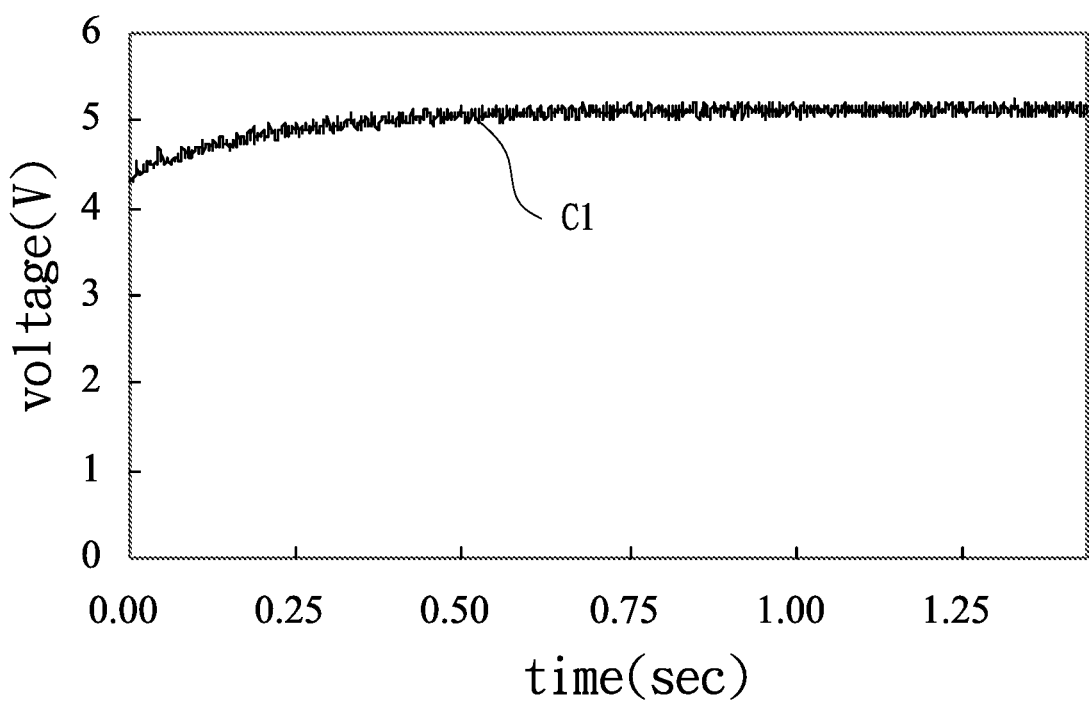
FIG. 3a shows a waveform diagram of the terminal voltage of the DC machine containing noise.
Figure 3B:
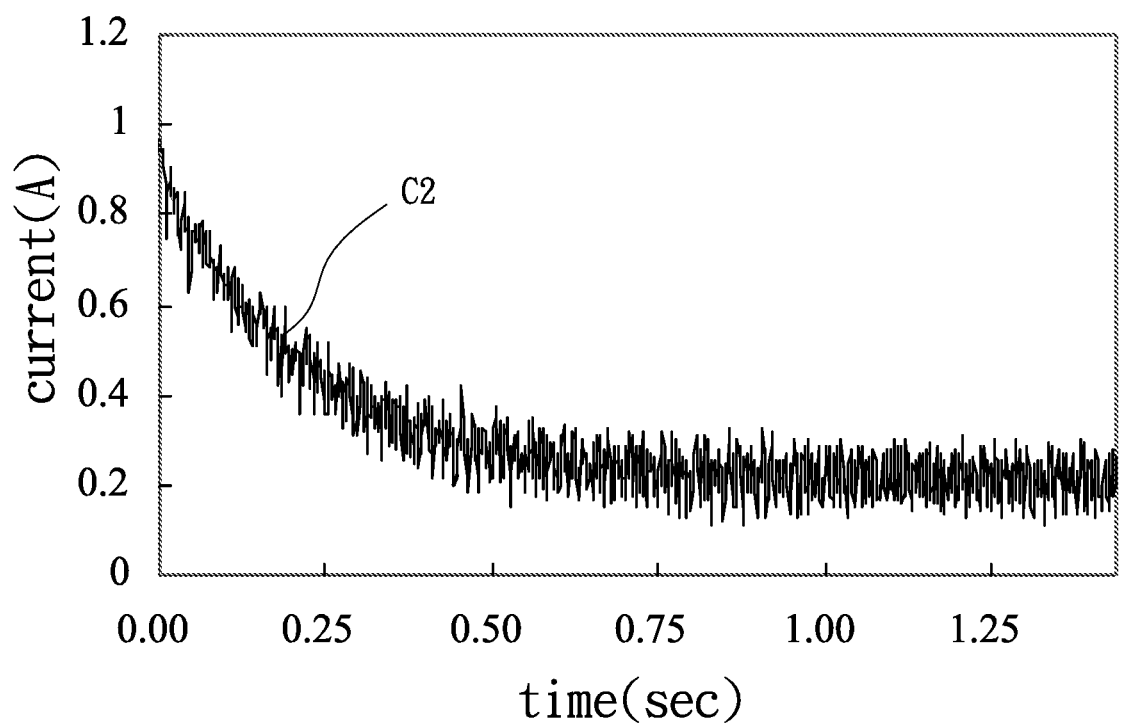
FIG. 3b shows a waveform diagram of the armature current of the DC machine containing noise.
Figure 3C:
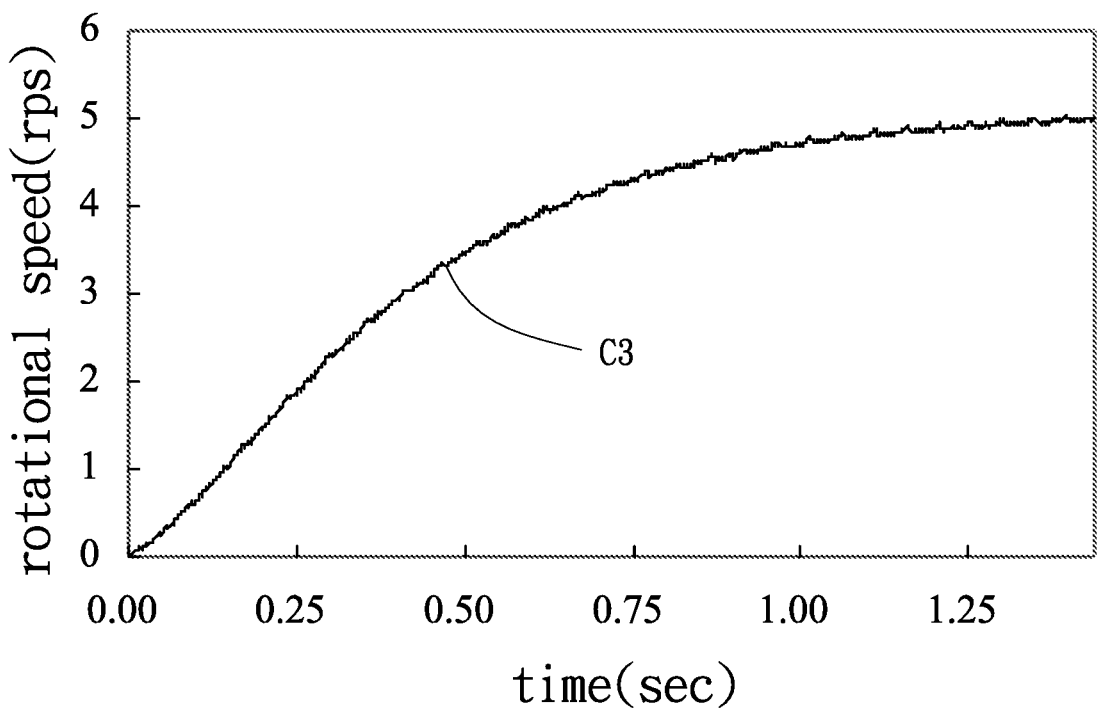
FIG. 3c shows a waveform diagram of the rotational speed of the DC machine containing noise.

For instance, in order to verify the noise-processing capability of the present disclosure, and to evaluate the accuracy and reliability under the practical use, a DC machine (e.g., the one with the power of 150 W) is provided as an example to verify and evaluate the present disclosure. Please refer to FIGS. 3a-3c, which are respectively the waveform diagrams of the terminal voltage, the armature current and the rotational speed of the DC machine containing noise. In the noise filtering step S2, the polynomial regression is calculated based on the polynomials of different degrees by the numerical calculation function of the computer system, so that the differences between the discrete values of the terminal voltage, the armature current and the rotational speed and the actual values are minimal to avoid the noise interference.

Specifically, the error rate between the discrete value of the terminal voltage, the armature current or the rotational speed and the discrete value obtained by the polynomial regression can be expressed as the following equation (19):

$$E_S = \sum_{n=1}^{N}(y_n - \hat{y}_n)^2 \bigg/ \sum_{n=1}^{N}(y_n)^2, \qquad (19).$$

In equation (19), "$E_S$" is the error rate between the original discrete value of the terminal voltage, the armature current or the rotational speed and the discrete value obtained by the polynomial regression, "$y_n$" is the original discrete value of the terminal voltage, the armature current or the rotational speed, $\hat{y}_n$ is the discrete value of the terminal voltage, the armature current or the rotational speed obtained by the polynomial regression, and "n" is the sampling sequence of the terminal voltage, the armature current or the rotational speed (e.g., n=1, 2, ..., N). As shown in Table 1 above, the error rate between the original discrete value of each of the terminal voltage, the armature current and the rotational speed, and the discrete value of each of the terminal voltage, the armature current and the rotational speed expressed by the polynomial regression, can be obtained after the calculation of the above equation (19).

Figure 4A:
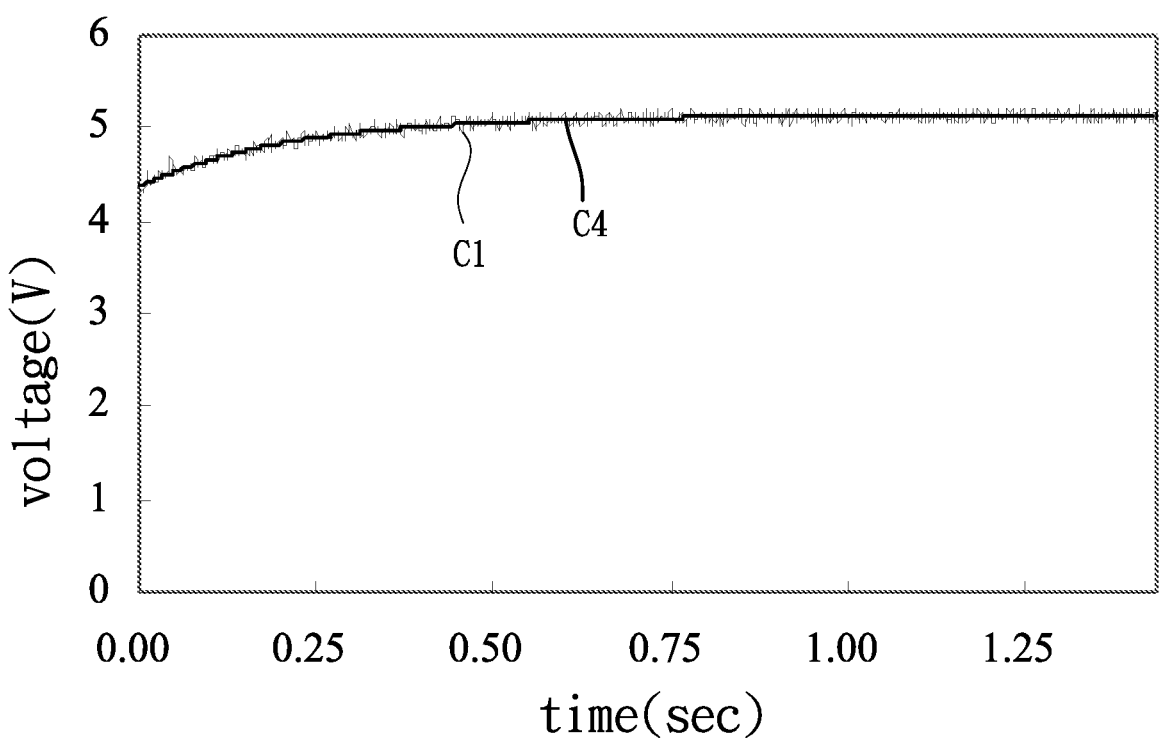
FIG. 4a shows a waveform diagram of the terminal voltage of the DC machine expressed by the polynomial regression.
Figure 4B:
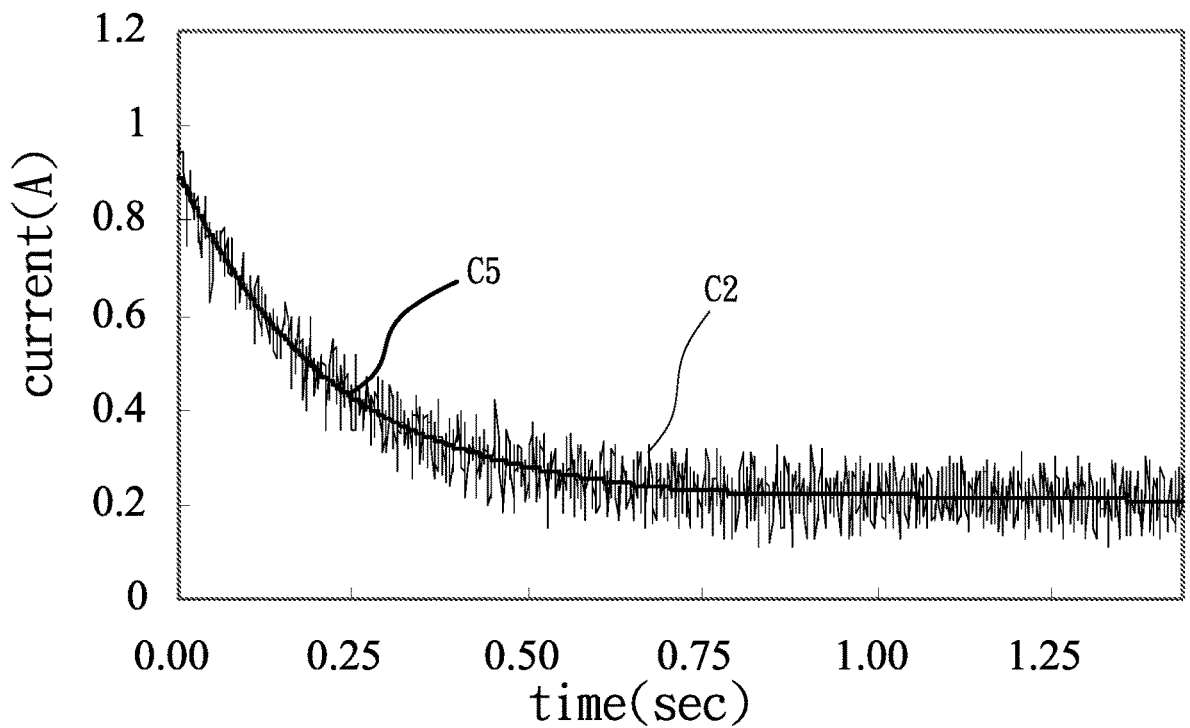
FIG. 4b shows a waveform diagram of the armature current of the DC machine expressed by the polynomial regression.
Figure 4C:
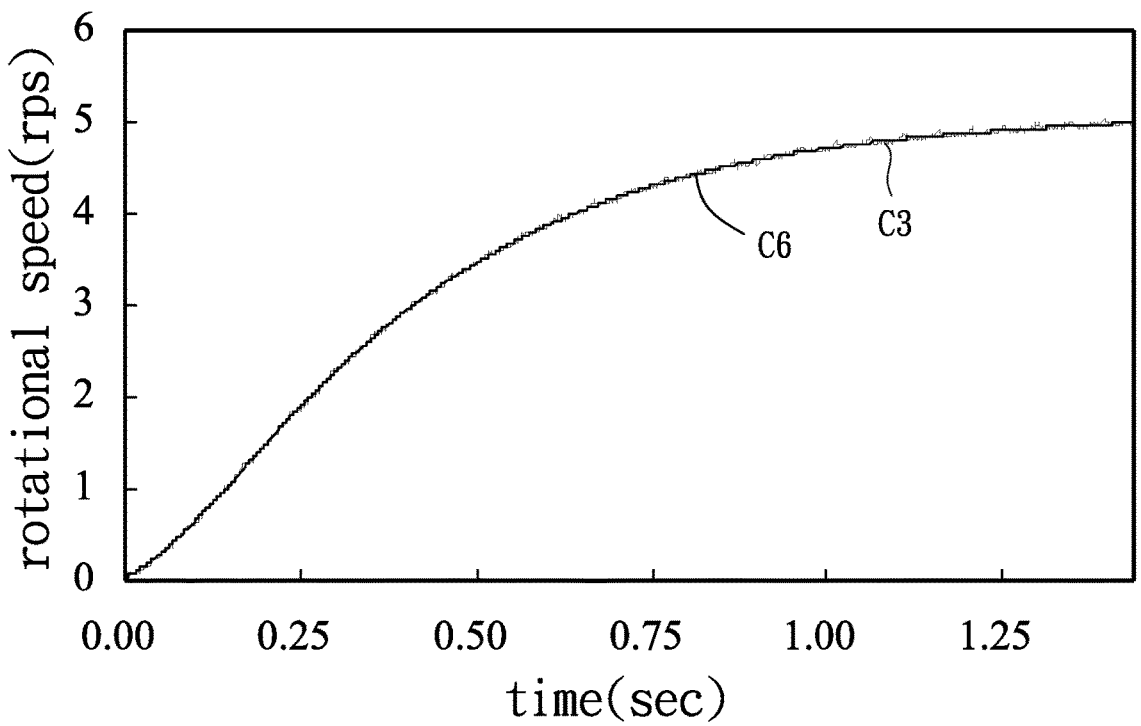
FIG. 4c shows a waveform diagram of the rotational speed of the DC machine expressed by the polynomial regression.

Moreover, referring to FIGS. 4a-4c, the original discrete values of the terminal voltage, the armature current and the rotational speed can be represented as a terminal voltage curve C1, an armature current curve C2 and a rotational speed curve C3, respectively. Besides, as can be seen from Table 1, when the polynomial regression is calculated based on a 5-degree polynomial in the noise filtering step S2, the terminal voltage curve C1, the armature current curve C2 and the rotational speed curve C3 are respectively converted into an estimated terminal voltage curve C4, an estimated armature current curve C5 and an estimated rotational speed curve C6. As such, the noise contained in the terminal voltage, the armature current and the rotational speed is completely filtered out while the transition characteristics of the DC machine can be maintained, improving the accuracy in estimating the parameters of the DC machine.

The following Table 2 shows the estimated results of the parameters of the equivalent circuit.

TABLE 2

| Parameters | Degree | | | |
|---|---|---|---|---|
| | 5 | 6 | 7 | 8 |
| $R_a$ (Ω) | 21.99 | 25.45 | 23.99 | 20.84 |
| $L_a$ (H) | 4.81 | 5.88 | 5.4 | 4.4 |
| $K_E$ (V/rps) | 0.124 | −0.039 | 0.02 | 0.17 |
| $E_E$ (*10$^{-3}$) (V) | 1.58 | 0.34 | 0.97 | 1.25 |

In addition, in order to proof that the estimated values of the parameters of the equivalent circuit as obtained by the polynomial regression are close to the actual values, the error rate between the original discrete value of the armature current and the discrete value of the armature current as expressed by the polynomial regression can be expressed as the following equation (20):

$$E_i = \sum_{n=1}^{N}(i_n - \hat{i}_n)^2 \bigg/ \sum_{n=1}^{N}(i_n)^2, \qquad (20).$$

Specifically, "$E_i$" is the error rate between the original discrete value of the armature current and the discrete value of the armature current expressed by the polynomial regression, "$i_n$" is the original discrete value of the armature current, $\hat{i}_n$ is the discrete value of the armature current expressed by the polynomial regression, and "n" is the sampling sequence of the armature current (e.g., n=1, 2, ..., N).

Figure 5A:
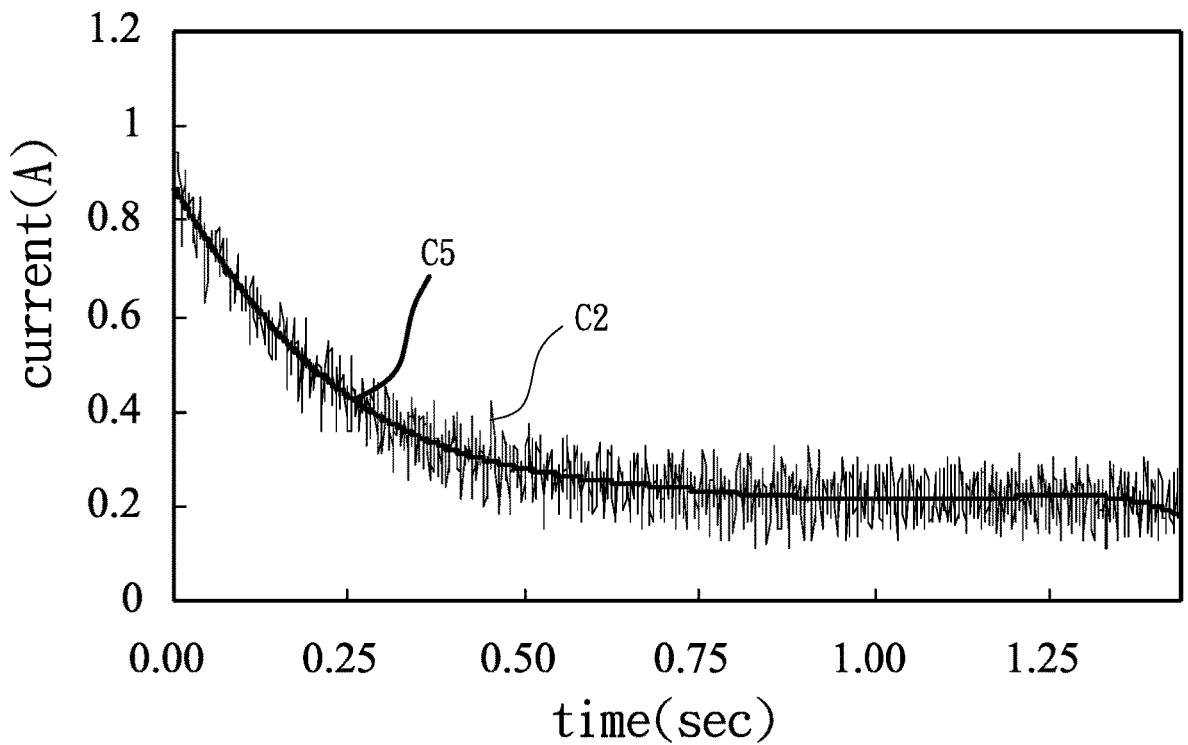
FIG. 5a shows a waveform diagram of the armature current of the DC machine expressed by the polynomial regression based on a 5-degree polynomial.
Figure 5B:
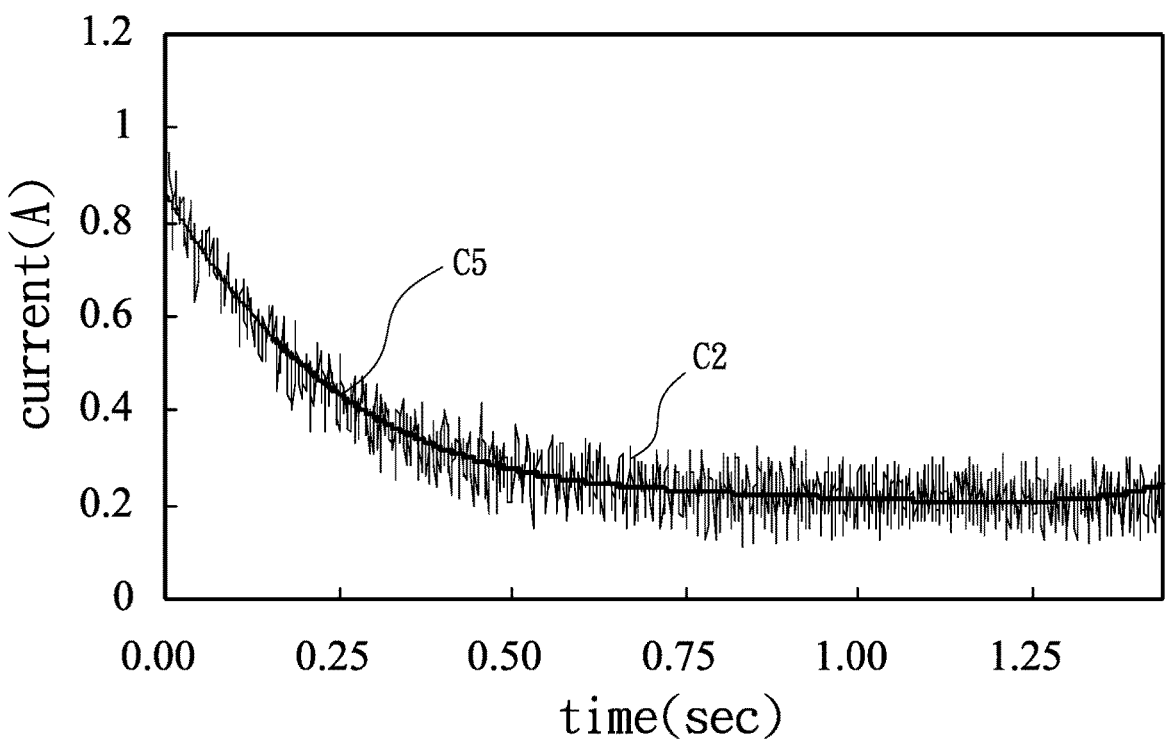
FIG. 5b shows a waveform diagram of the armature current of the DC machine expressed by the polynomial regression based on a 7-degree polynomial.
Figure 5C:
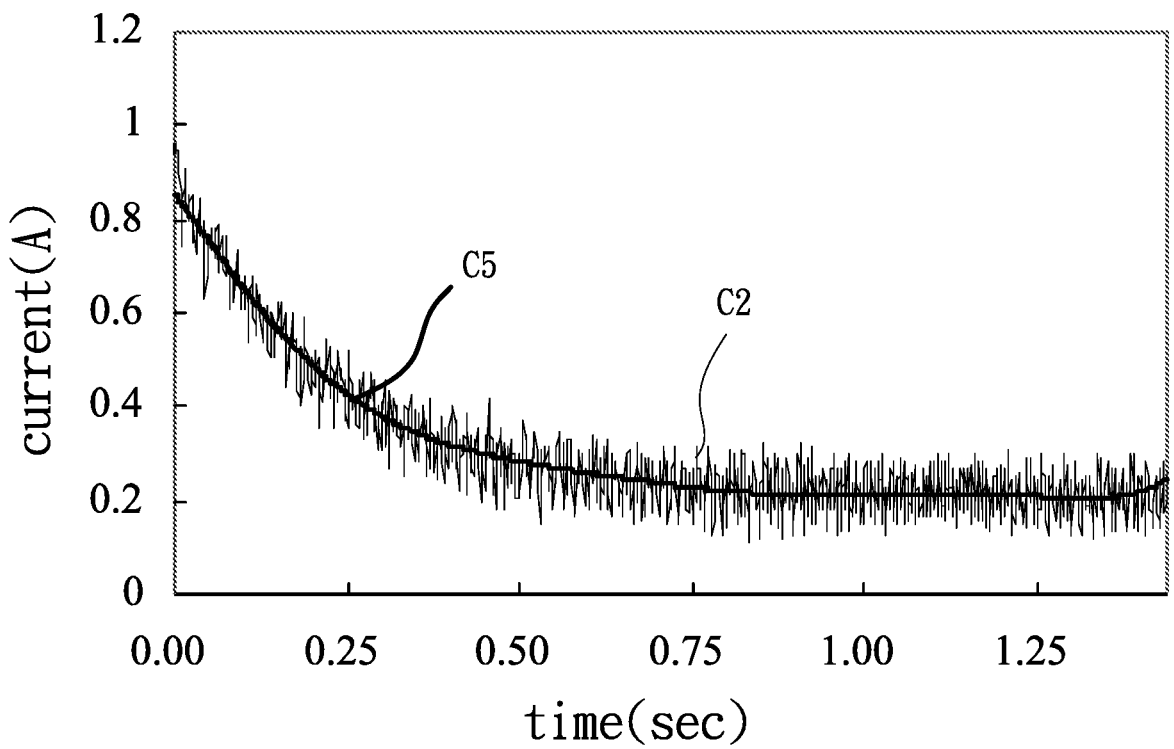
FIG. 5c shows a waveform diagram of the armature current of the DC machine expressed by the polynomial regression based on an 8-degree polynomial.

With reference to FIGS. 5a-5c and Table 2, the estimated armature current curve C5 matches the armature current curve C2. The back electromotive force constants ($K_E$) obtained when the polynomial regression is calculated based on a 5-degree, a 7-degree and an 8-degree polynomials are positive, which matches the transition characteristics of the DC machine. As such, the errors between the estimated values of the parameters of the equivalent circuit and the actual values are relatively small, improving the reliability in estimating the parameter values of the DC machine.

The following Table 3 is the estimated results of the parameters of the equivalent mechanism.

TABLE 3

| Parameters | Degree | | |
|---|---|---|---|
| | 5 | 7 | 8 |
| J (g · m$^2$) | 7.4 | 1.2 | 10.3 |
| B (g · m/rps) | 3.4 | 0.5 | 4.5 |
| $E_T$ (*10$^{-3}$) (rps) | 5.68 | 5.37 | 5.32 |

In addition, in order to proof that the estimated values of the parameters of the equivalent mechanism obtained by expressing the discrete values of the rotational speed by the polynomial regression are close to the actual values, the error rate between the original discrete value of the rotational speed and the discrete value of the rotational speed as expressed by the polynomial regression can be expressed as the following equation (21):

$$E_w = \sum_{n=1}^{N}(\omega_n - \hat{\omega}_n)^2 \bigg/ \sum_{n=1}^{N}(\omega_n)^2, \qquad (21).$$

Specifically, "$E_W$" is the error rate between the original discrete value and the discrete value of the rotational speed as expressed by the polynomial regression, "$\omega_n$" is the original discrete value of the armature current, $\hat{\omega}_n$ is the discrete value of the rotational speed expressed by the polynomial regression, and "n" is the sampling sequence of the rotational speed (e.g., n=1, 2, ..., N).

With reference to Table 3, when the polynomial regression is calculated based on a 5-degree polynomial, the moment of inertia (J) is determined to be 7.4 (g·m$^2$) and the viscous friction coefficient (B) is determined to be 3.4

Figure 6A:
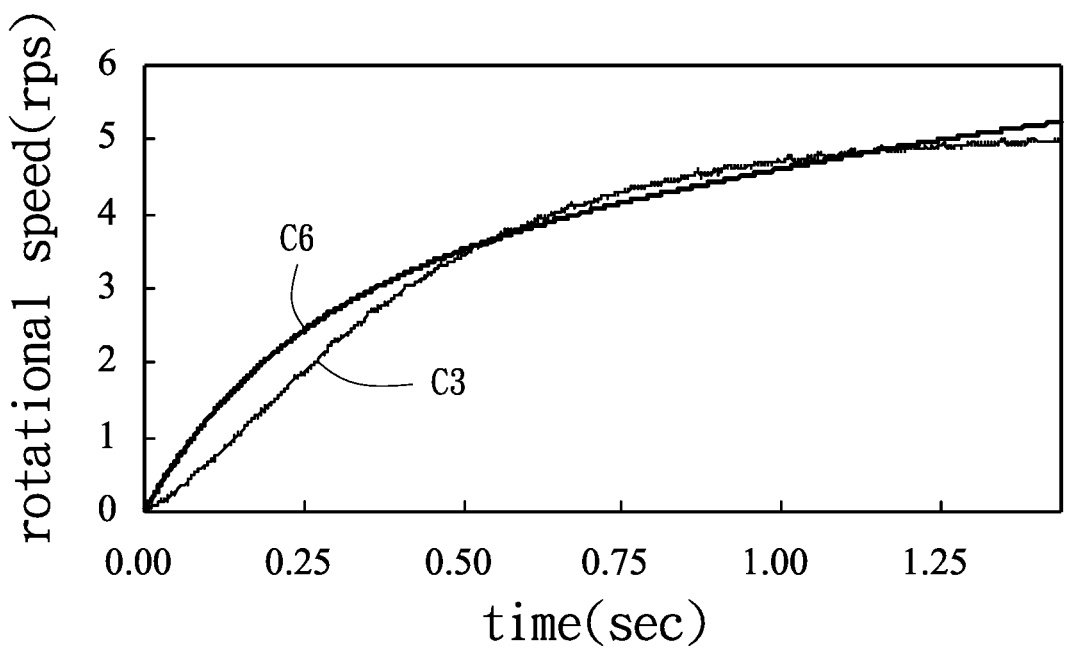
FIG. 6a shows a waveform diagram of the rotational speed of the DC machine expressed by the polynomial regression based on a 5-degree polynomial.
Figure 6B:
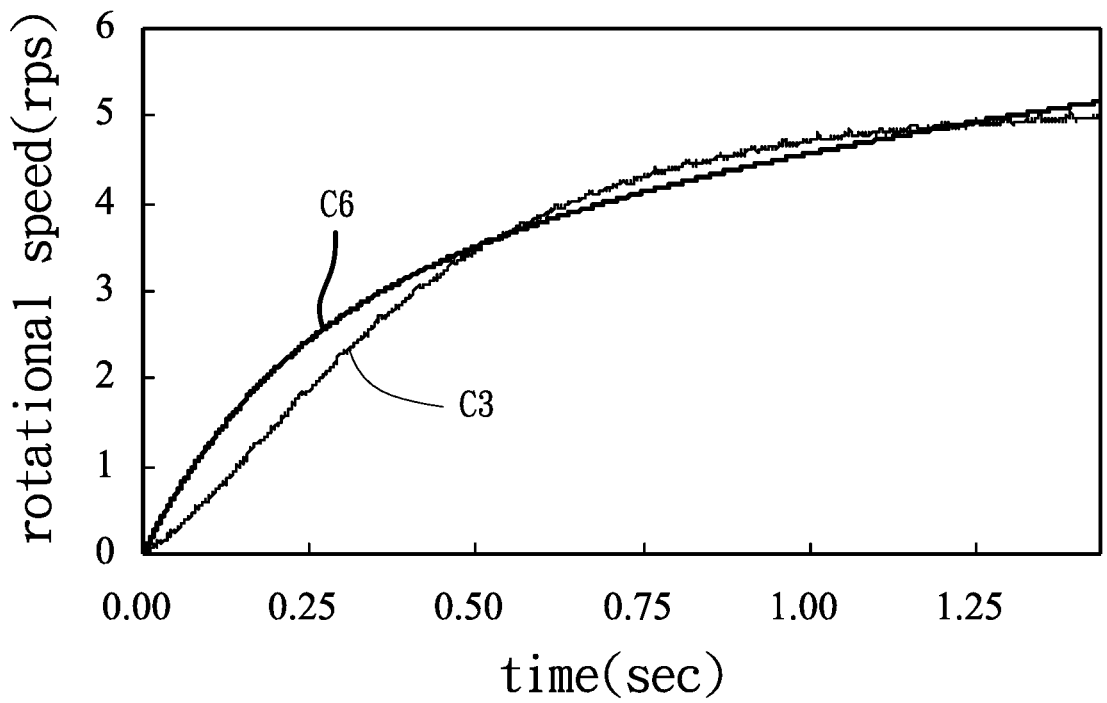
FIG. 6b shows a waveform diagram of the rotational speed of the DC machine expressed by the polynomial regression based on a 7-degree polynomial.
Figure 6C:
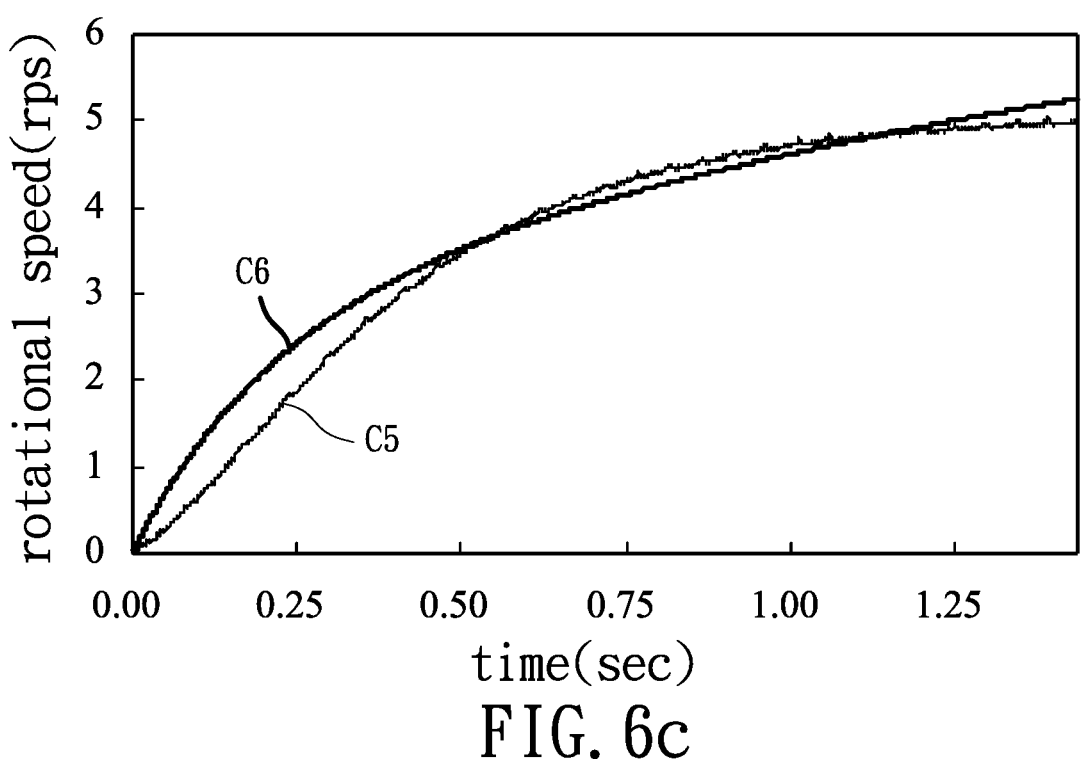
FIG. 6c shows a waveform diagram of the rotational speed of the DC machine expressed by the polynomial regression based on an 8-degree polynomial.

(mN·m·sec/rad). Besides, based on the calculation of the above equation (21), the error rate between the original discrete value of the rotational speed and the discrete value of the rotational speed as expressed by the polynomial regression is $5.68*10^{-3}$ (rad/sec), which is very small. Furthermore, with reference to FIGS. 6a-6c, the estimated rotational speed curve C6 matches the rotational speed curve C3. This shows that the estimated values of the parameters of the equivalent mechanism are consistent with the actual situation. Thus, the reliability in estimating the parameters of the DC machine can be improved.

In addition, by using a programming language (such as C++, Java, etc.), the method for estimating the parameters of the DC machine by the least-squares method according to the above embodiment of the disclosure can be implemented as a computer program (such as a DC machine parameter estimation program for determining whether the estimated value of parameter of the DC machine is consistent with the actual behavior of the DC machine). The coding of the computer program can be understood by a person skilled in the art. The program code can be utilized to produce a computer program product with a built-in computer program. As such, when a computer system loads and executes the computer program, the method for estimating the parameters of the DC machine by the least-squares method according to the above embodiment of the disclosure can be performed.

In summary, since the discrete values of the terminal voltage, the armature current and the rotational speed are expressed by the polynomial regression, the method for estimating the parameters of the DC machine by the least-squares method according to an embodiment of the disclosure is able to maintain the transition characteristics of the DC machine while the noise is completely filtered. Moreover, the method according to the embodiment of the disclosure may minimize the difference between the estimated value of the parameter of the DC machine and the actual value by the least-squares method, such that the estimated value of the parameter of the DC machine can be close to the actual value and can be consistent with the actual behavior of the DC machine. Furthermore, it requires only one calculation process to obtain the estimated value, eliminating the need of multiple operations. Advantageously, the accuracy and reliability in estimating the parameters of the DC machine can be improved, achieving high computational efficiency as well as simplifying the operational procedure.

Although the disclosure has been described in detail with reference to its presently preferable embodiments, it will be understood by one of ordinary skill in the art that various modifications can be made without departing from the spirit and the scope of the invention, as set forth in the appended claims.

What is claimed is:

1. A method for estimating parameters of a direct current (DC) machine by least-squares method as executed by a computer system dedicated to estimating the parameters of the direct current machine, wherein the computer system includes a calculation module, a human machine interface, a data retrieval module, a servo driver, a servo motor and the DC machine, with the method comprising:

establishing a transient model of the direct current machine by the calculation module, wherein the transient model includes an equivalent circuit and an equivalent mechanism, wherein the equivalent circuit includes an armature resistance, an armature inductance and a back electromotive force, and wherein the equivalent mechanism includes a torque, a moment of inertia and a viscous friction coefficient;

sampling the terminal voltage, the armature current and the rotational speed of the direct current machine at a plurality of time points by the computer system, as performed by the data retrieval module;

quantizing each of the terminal voltage, the armature current and the rotational speed into a discrete value at each of the plurality of time points when the direct current machine is started, as performed by the data retrieval module;

expressing the discrete values of the terminal voltage, the armature current and the rotational speed by polynomial regression by the calculation module;

calculating a product of the armature resistance and the armature current, a product of the armature inductance and a time-varying rate of the armature current, and a product of the back electromotive force constant and the rotational speed, as performed by the calculation module;

adding the three products to obtain an estimated voltage value, as performed by the calculation module;

expressing a difference between the terminal voltage and the estimated voltage value by the least-squares method as a first error function, as performed by the calculation module;

obtaining estimated values of the armature resistance, the armature inductance and the back electromotive force constant according to the first error function, as performed by the calculation module;

calculating a value of the torque based on the back electromotive force constant and the armature current, as performed by the calculation module;

calculating another product of the moment of inertia and a time-varying rate of the rotational speed, and a further product of the viscous friction coefficient and the rotational speed, as performed by the calculation module;

adding the other product and the further product to obtain an estimated torque value, as performed by the calculation module;

expressing a difference between the value of the torque and the estimated torque value by the least-squares method as a second error function, as performed by the calculation module;

obtaining estimated values of the moment of inertia and the viscous friction coefficient according to the second error function, as performed by the calculation module; and outputting the estimated values of the armature resistance, the armature inductance, the back electromotive force constant, the moment of inertia and the viscous friction coefficient to the data retrieval module.

2. The method for estimating the parameters of the direct current machine by the least-squares method as claimed in claim 1, wherein the discrete values of the terminal voltage, the armature current and the rotational speed are expressed by the polynomial regression as below:

$y_n = a_m n^m + a_{m-1} n^{m-1} + \ldots + a_1 n + a_0$, $n=1, \ldots, N$.

wherein "$y_n$" is the discrete value of the terminal voltage, the armature current or the rotational speed, wherein "n" is a sampling sequence of the terminal voltage, the armature current or the rotational speed, and wherein $[a_0, a_1, \ldots, a_{m-1}, a_m]$ are polynomial coefficients of a m-degree polynomial.

3. The method for estimating the parameters of the direct current machine by the least-squares method as claimed in claim 1, wherein the first error function is expressed as:

$$E_V = \sum_{n=1}^{N}\left(v_n - R_a i_n - L_a \frac{di_n}{dt} - K_E \omega_n\right)^2,$$

wherein "$E_V$" is the difference between the terminal voltage and the estimated voltage value, wherein "$v_n$", "$i_n$" and "$\omega_n$" are the discrete values of the terminal voltage, the armature current and the rotational speed, wherein "$R_a$" is the armature resistance, wherein "$L_a$" is the armature inductance, wherein "$di_n/dt$" is the time-varying rate of the armature current, wherein "$K_E$" is the back electromotive force constant, and wherein "n" is the sampling sequence of the terminal voltage, the armature current and the rotational speed.

4. The method for estimating the parameters of the direct current machine by the least-squares method as claimed in claim 3, wherein, when partial derivatives of the armature resistance, the armature inductance and the back electromotive force constant are made zero, the estimated values of the armature resistance, the armature inductance and the back electromotive force constant are calculated as:

$$\begin{bmatrix} R_a \\ L_a \\ K_E \end{bmatrix} = \begin{bmatrix} \sum_{n=1}^{N} i_n i_n & \sum_{n=1}^{N} \frac{di_n}{dt} i_n & \sum_{n=1}^{N} \omega_n i_n \\ \sum_{n=1}^{N} i_n \frac{di_n}{dt} & \sum_{n=1}^{N} \frac{di_n}{dt}\frac{di_n}{dt} & \sum_{n=1}^{N} \omega_n \frac{di_n}{dt} \\ \sum_{n=1}^{N} i_n \omega_n & \sum_{n=1}^{N} \frac{di_n}{dt}\omega_n & \sum_{n=1}^{N} \omega_n \omega_n \end{bmatrix}^{-1} \begin{bmatrix} \sum_{n=1}^{N} v_n i_n \\ \sum_{n=1}^{N} v_n \frac{di_n}{dt} \\ \sum_{n=1}^{N} v_n \omega_n \end{bmatrix}.$$

5. The method for estimating the parameters of the direct current machine by the least-squares method as claimed in claim 1, wherein the second error function is expressed as:

$$E_T = \sum_{n=1}^{N}\left(T_n - J\frac{d\omega_n}{dt} - B\omega_n\right)^2,$$

wherein "$E_T$" is the difference between the torque and the estimated torque value, wherein "$T_n$" is the torque, wherein "J" is the moment of inertia, wherein "$d\omega_n/dt$" is the time-varying rate of the rotational speed, wherein "B" is the viscous friction coefficient, wherein "$\omega_n$" is the discrete value of the rotational speed, wherein "n" is the sampling sequence of the rotational speed, and wherein n=1, 2, . . . , N.

6. The method for estimating the parameters of the direct current machine by the least-squares method as claimed in claim 5, wherein, when partial derivatives of the moment of inertia and the viscous friction coefficient are made zero, the estimated values of the moment of inertia and the viscous friction coefficient are calculated as:

$$\begin{bmatrix} J \\ B \end{bmatrix} = \begin{bmatrix} \sum_{n=1}^{N}\left(\frac{d\omega_n}{dt}\right)^2 & \sum_{n=1}^{N} \omega_n \frac{d\omega_n}{dt} \\ \sum_{n=1}^{N} \omega_n \frac{d\omega_n}{dt} & \sum_{n=1}^{N} (\omega_n)^2 \end{bmatrix}^{-1} \begin{bmatrix} \sum_{n=1}^{N} T_n \frac{d\omega_n}{dt} \\ \sum_{n=1}^{N} T_n \omega_n \end{bmatrix}.$$

7. The method for estimating the parameters of the direct current machine by the least-squares method as claimed in claim 1, wherein the computer system samples the armature current at the plurality of time points by a Hall device.

8. The method for estimating the parameters of the direct current machine by the least-squares method as claimed in claim 1, wherein the computer system samples the rotational speed at the plurality of time points by a frequency/voltage converter and a photo interrupter.

9. The method for estimating the parameters of the direct current machine by the least-squares method as claimed in claim 1, wherein the computer system samples the terminal voltage at the plurality of time points by a resistor-formed voltage divider.

10. An apparatus for estimating parameters of a direct current (DC) machine by least-squares method comprising a computer system dedicated to performing the method as claimed in claim 1.

* * * * *